(12) United States Patent
Osaka

(10) Patent No.: US 11,320,741 B2
(45) Date of Patent: May 3, 2022

(54) LIGHT SOURCE APPARATUS, ILLUMINATION APPARATUS, EXPOSURE APPARATUS, AND METHOD FOR MANUFACTURING OBJECT

(71) Applicant: CANON KABUSHIKI KAISHA, Tokyo (JP)

(72) Inventor: Noboru Osaka, Habikino (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/691,425

(22) Filed: Nov. 21, 2019

(65) Prior Publication Data

US 2020/0174377 A1    Jun. 4, 2020

(30) Foreign Application Priority Data

Nov. 30, 2018 (JP) .............................. JP2018-225486

(51) Int. Cl.
  *G03F 7/20* (2006.01)
  *G03F 7/26* (2006.01)

(52) U.S. Cl.
  CPC ........ *G03F 7/70091* (2013.01); *G03F 7/7005* (2013.01); *G03F 7/70191* (2013.01); *G03F 7/201* (2013.01); *G03F 7/2008* (2013.01); *G03F 7/26* (2013.01)

(58) Field of Classification Search
  CPC ............. G03F 7/70058; G03F 7/70075; G03F 7/70083; G03F 7/70091; G03F 7/70125; G03F 7/7015; G03F 7/70191
  See application file for complete search history.

(56) References Cited

U.S. PATENT DOCUMENTS

| | | | |
|---|---|---|---|
| 8,274,226 B1 * | 9/2012 | Sikora .................... | B60Q 1/24 315/77 |
| 2008/0111983 A1 * | 5/2008 | Singer ................. | G03F 7/70083 355/69 |
| 2010/0220306 A1 * | 9/2010 | Malach ............... | G03F 7/70075 355/70 |
| 2014/0211174 A1 * | 7/2014 | Miyake ............... | G03F 7/70566 355/27 |
| 2017/0343903 A1 * | 11/2017 | Lee ..................... | G03F 7/70283 |

FOREIGN PATENT DOCUMENTS

| | | |
|---|---|---|
| JP | 2018-4868 A | 1/2018 |
| JP | 2018-22884 A | 2/2018 |
| TW | 201409187 A | 3/2014 |
| TW | 201734659 A | 10/2017 |

* cited by examiner

*Primary Examiner* — Michelle M Iacoletti

(74) *Attorney, Agent, or Firm* — Canon U.S.A., Inc. IP Division

(57) ABSTRACT

The present invention is directed to adjusting a light intensity distribution on an irradiation target surface into a desired distribution with use of a light source apparatus including a light emitting diode (LED) array. A light source apparatus includes an LED array including a plurality of LED chips, and a controller configured to control the plurality of LED chips. A light intensity distribution acquired from each of the plurality of LED chips is superimposed on a light intensity distribution oriented in a different direction from each other on a predetermined surface. The controller controls an output of at least one of the plurality of LED chips, thereby changing the light intensity distribution that the plurality of LED chips forms on the predetermined surface.

8 Claims, 10 Drawing Sheets

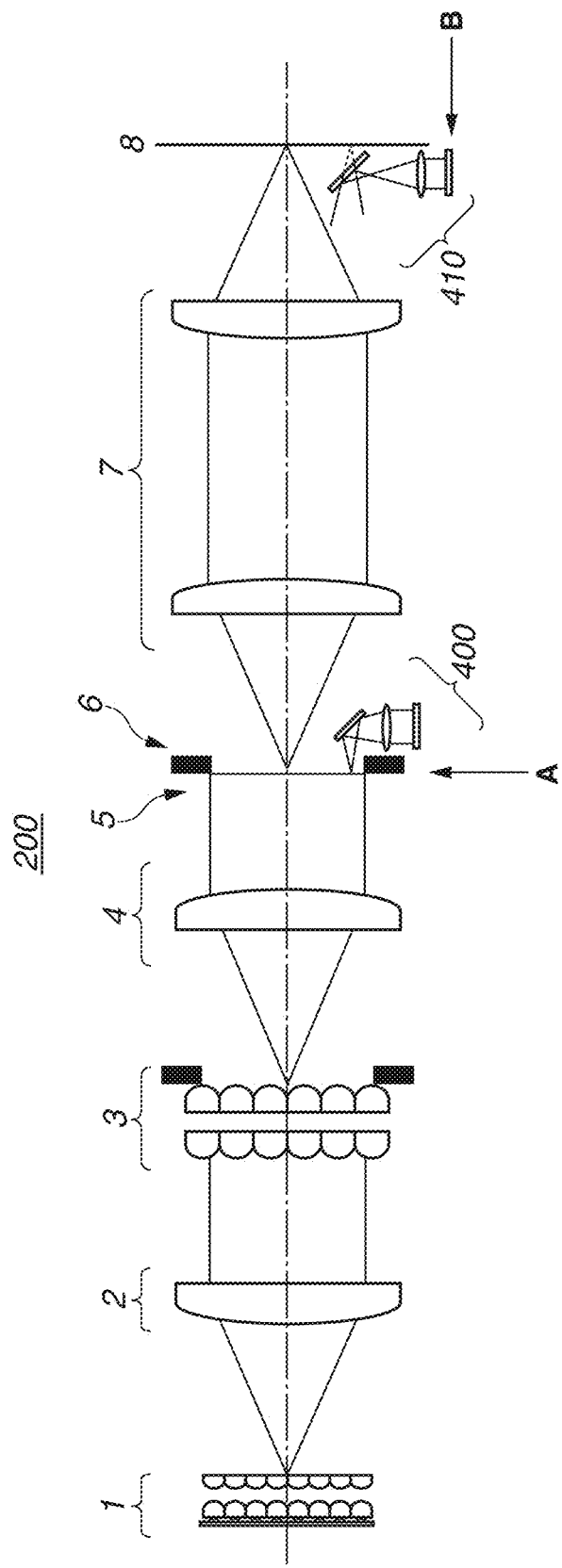

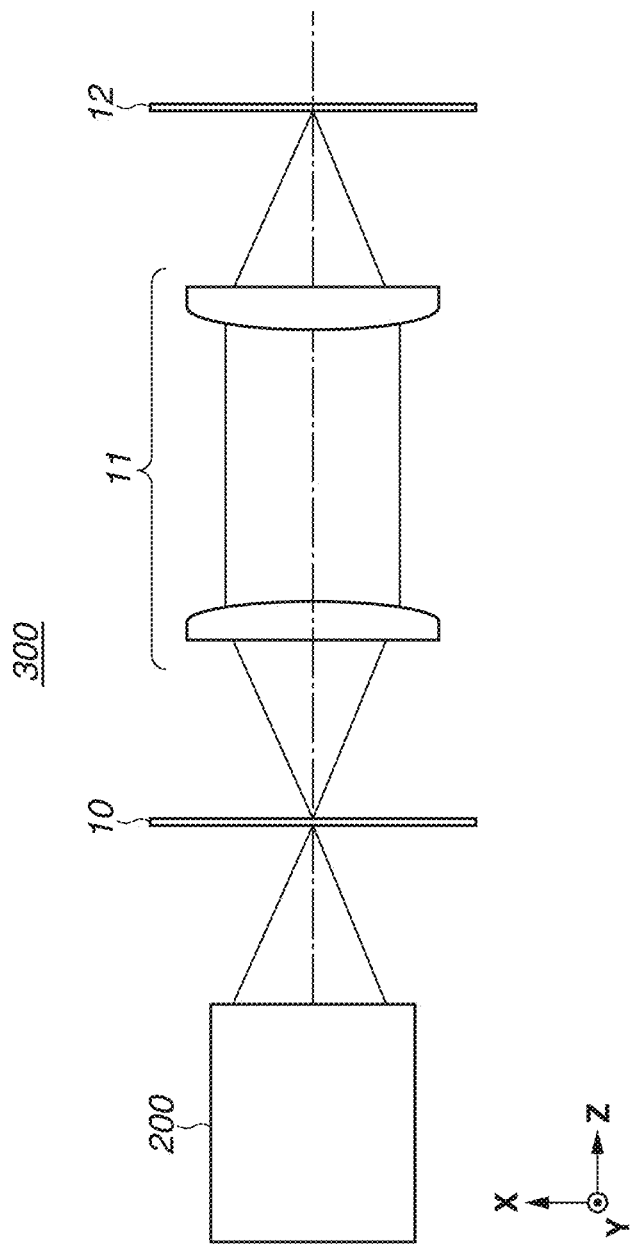

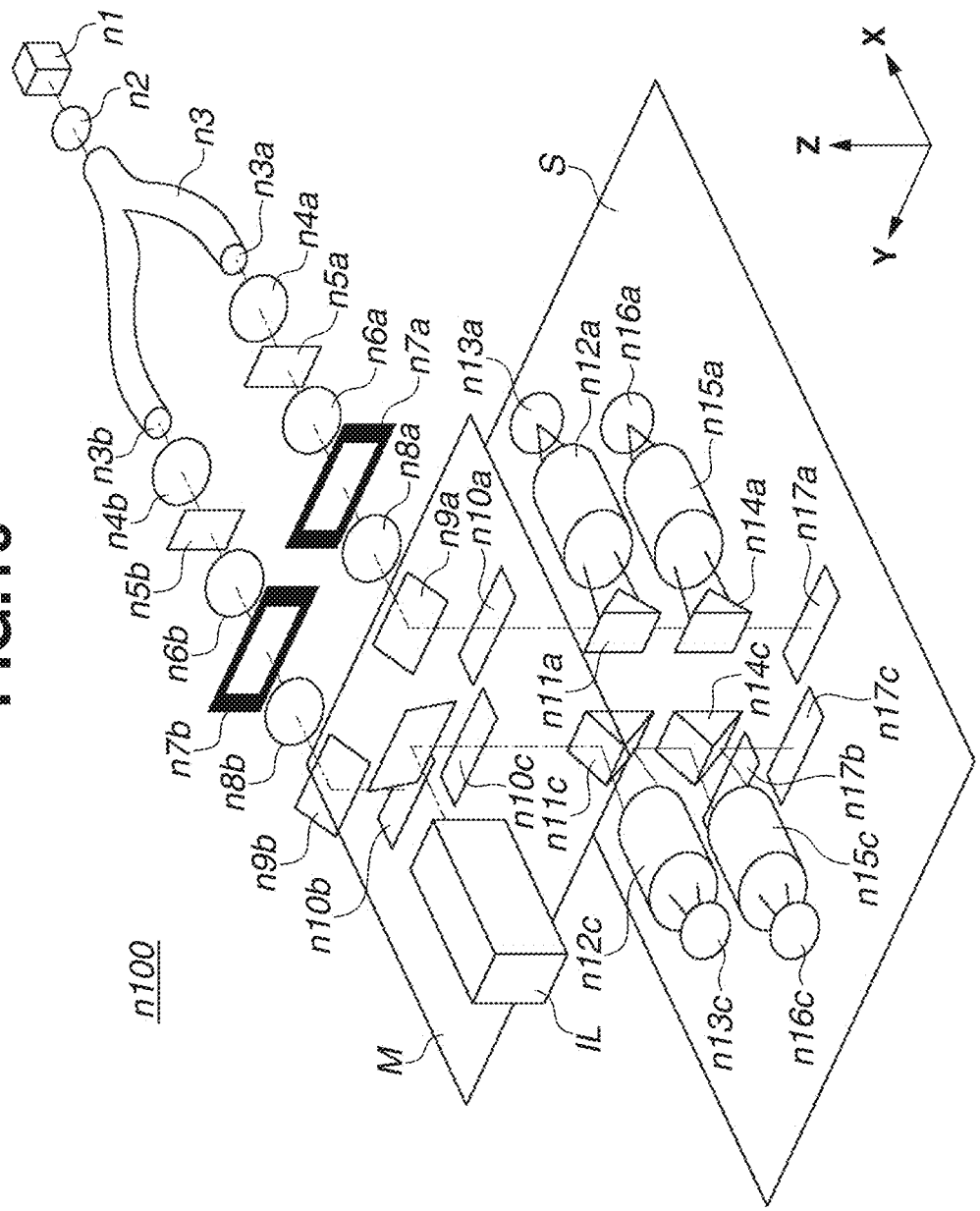

1

LIGHT SOURCE APPARATUS, ILLUMINATION APPARATUS, EXPOSURE APPARATUS, AND METHOD FOR MANUFACTURING OBJECT

BACKGROUND

Field of the Disclosure

The present disclosure relates to a light source apparatus, an illumination apparatus, an exposure apparatus, and a method for manufacturing an object.

Description of the Related Art

An exposure apparatus is used in a process of manufacturing a semiconductor device or a flat panel display (FPD). In a lithography process, the exposure apparatus transfers a pattern of a master (a reticle or a mask) onto a photosensitive substrate (for example, a wafer or a glass plate with a resist layer formed on a surface thereof) via a projection optical system.

For example, a mercury lamp has been used as a light source of the projection exposure apparatus, but, in recent years, in place of the mercury lamp, an energy-saving light emitting diode (LED) has been expected to replace it. The LED also features a long life because being able to stabilize an output of the light in a short time after a current is applied to a substrate circuit that controls the light emission, and not having to continue the light emission all the time unlike the mercury lamp.

However, the light output per LED is extremely small compared to the light output of the mercury lamp. Therefore, when the LED is employed in place of the light source using the mercury lamp, a total light output is required to be increased by using an LED array including a plurality of LEDs arrayed on a substrate.

Japanese Patent Application Laid-Open No. 2018-4868 discusses a technique for achieving an even light intensity distribution on an irradiation target surface with use of a Dove prism corresponding to each of the plurality of LEDs arrayed on the substrate. Further, Japanese Patent Application Laid-Open No. 2018-22884 discusses a technique for making light and dark unnoticeable on the irradiation target surface by arranging the plurality of LED elements at different angles from one another.

The techniques discussed in Japanese Patent Application Laid-Open Nos. 2018-4868 and 2018-22884 are directed to establishing the even light amount distribution on the irradiation target surface, and cannot adjust the light intensity distribution on the irradiation target surface into a desired distribution different from the even distribution.

SUMMARY

According to an aspect of the present invention, a light source apparatus includes an LED array including a plurality of LED chips, and a controller configured to control the plurality of LED chips. A light intensity distribution acquired from the plurality of LED chips is superimposed on a different light intensity distribution on a predetermined surface. The controller controls an output of at least one of the plurality of LED chips, thereby changing the light intensity distribution that the plurality of LED chips forms on the predetermined surface.

Further features of the present invention will become apparent from the following description of exemplary embodiments with reference to the attached drawings.

BRIEF DESCRIPTION OF THE DRAWINGS

FIG. 3 is a schematic view of an illumination optical system.

FIG. 8 is a schematic view of an exposure apparatus.

FIG. 10 illustrates another example of the exposure apparatus.

DESCRIPTION OF THE EMBODIMENTS

In the following description, representative exemplary embodiments of the present invention will be described in detail with reference to the accompanying drawings.

Figure 1:
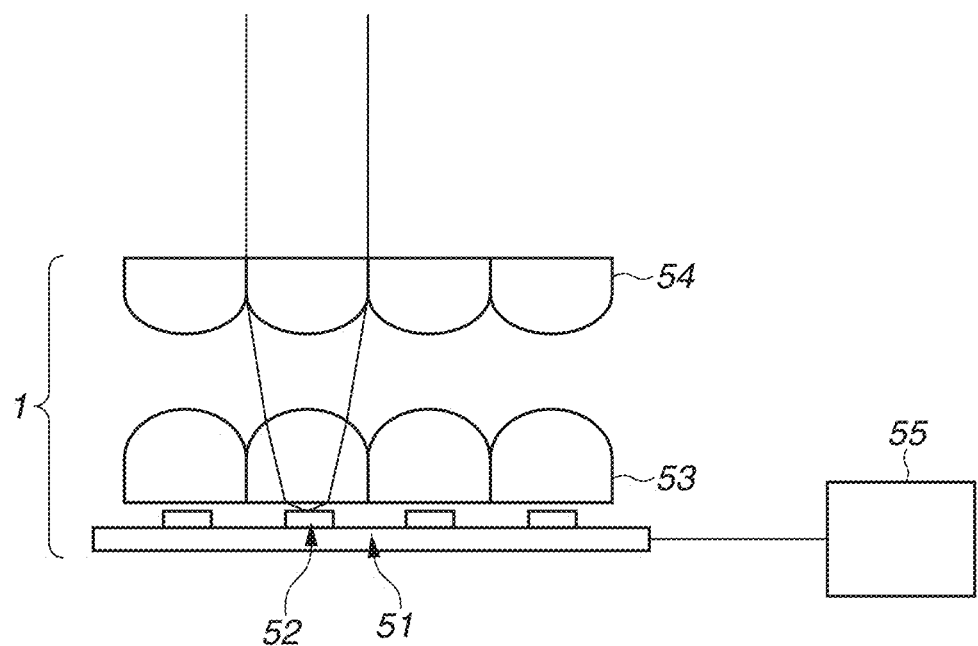
FIG. 1 is a schematic cross-sectional view of a light source unit.

A light source unit (a light source apparatus) 1 will be described with reference to FIG. 1. FIG. 1 is a schematic cross-sectional view of the light source unit 1. The light source unit 1 includes a substrate 51, a light emitting diode (LED) chip 52, collective lenses 53 and 54, and a control unit 55. A plurality of LED chips 52 is disposed on the substrate 51, and they will be referred to as an LED array unit. A circuit for driving the LED chips 52 is formed on the substrate 51, and light at a predetermined wavelength is output from each of the LED chips 52 when a current is applied to the circuit. The control unit 55 controls the current to apply to each of the LED chips 52, thereby controlling a luminance (an intensity) of the light output from each of the LED chips 52.

The collective lenses 53 and 54 are lens arrays including each lens provided in correspondence with each of the LED chips 52. Each of the lenses of the collective lens 53 is provided above each of the LEDs. The lens may be a planoconvex lens as illustrated in FIG. 1, or may have another powered shape. A lens array prepared by continuously forming lenses by etching, cutting, or the like, or a lens array prepared by joining individual lenses together can be used as the lens array. The light fluxes emitted from the LED chips 52 each spread across approximately 50 to 70 degrees in terms of an half angle, but they are converted into approximately 30 degrees or narrower by the collective lenses 53 and 54. The collective lens 53 may be provided so as to be spaced apart from the LED chips 52 by a predetermined interval, and be fixed integrally together with the substrate 51.

Figure 2A:
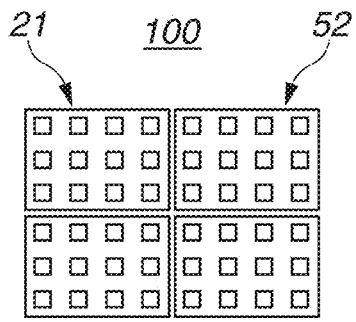
FIGS. 2A, 2B, 2C, and 2D are each a plan view of a light emitting diode (LED) array.

Next, the LED array included in the light source unit 1 will be described. FIGS. 2A to 2D each illustrate an example of the LED array. FIG. 2A is a plan view of an LED array 100. The LED array 100 includes four subunits (LED groups) 21, in each of which the LED chips 52 laid out in three rows and four columns, i.e., twelve LED chips 52 in total are arrayed on the substrate. The LED chips 52 mounted on each of the subunits 21 are quadrilateral, and each of them is arranged at the same orientation.

Figure 2C:
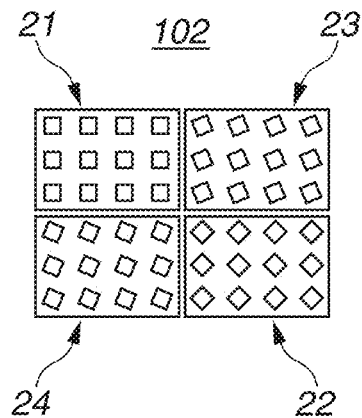
Figure 2B:
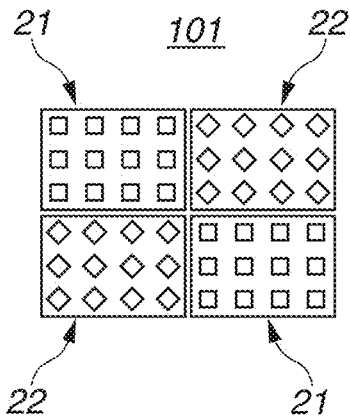

FIG. 2B is a plan view of an LED array 101. The LED array 101 uses the subunits 21 as two of four subunits thereof, and uses subunits 22 as the remaining two units. In each of the subunits 22, the LED chips 52 laid out in three rows and four columns, i.e., twelve LED chips 52 in total are also arrayed on the substrate. In the subunits 22, the LED chips 52 mounted thereon are arranged so as to be inclined at approximately 45 degrees, compared to the subunits 21. In this manner, the plurality of LED chips 52 are arranged at the same orientation within one subunit (within one LED group), and the LED chips 52 are arranged at different orientations among the plurality of subunits (among the LED groups).

FIG. 2C is a plan view of an LED array 102. The LED array 102 includes subunits 23 and 24 besides the subunits 21 and 22. In each of the subunits 23 and 24, the LED chips 52 laid out in three rows and four columns, i.e., twelve LED chips 52 in total are also arrayed on the substrate. The subunits 23 and 24 are subunits including the chips 52 oriented with angles of about +22.5 degrees and −22.5 degrees with respect to the LED chips 52 in the subunits 21, respectively.

Figure 2D:
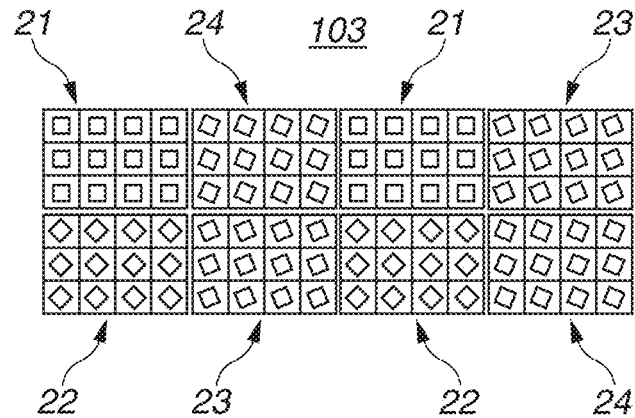

FIG. 2D is a plan view of an LED array 103. The LED array 103 is an LED array in which two sets are arranged for each of the subunits 21 to 24.

The LED chips 52 are laid out in the three rows and the four columns in each of the subunits 21 to 24, but may be laid out in a different layout from the three rows and the four columns. For example, each of the subunits 21 to 24 may be an LED array including two LED chips 52 orientated with different angles from each other. However, considering employment thereof for an exposure apparatus that will be described below, it can be said to be more desirable to form one subunit by a plurality of LED arrays equalized to some degree, because this makes an optical performance easily controllable. Further, the orientation angle is also not limited to 0 degrees, 22.5 degrees, and 45 degrees, and the LED chips 52 may be oriented at various angles. Further, like the LED array discussed in Japanese Patent Application Laid-Open No. 2018-22884, the light source unit 1 may include the plurality of LED chips 52 arranged on the substrate at the same orientation as one another, and rotate the light flux from the LED with use of the Dove prism corresponding to each of the LEDs.

The control unit 55 may control an output LED-chip by LED-chip, or may collectively control outputs of the plurality of LED chips 52 included in one subunit to control the outputs of the LEDs subunit by subunit.

An example of an illumination optical system (an illumination apparatus) will be described with reference to FIG. 3. FIG. 3 is a schematic cross-sectional view of the illumination optical system. An illumination optical system 200 includes the light source unit 1, a condenser lens 2, a fly-eye optical system 3, a condenser lens 4, a field stop 6, and an imaging optical system 7.

The light flux output from the light source unit 1 passes through the condenser lens 2 and reaches the fly-eye optical system 3. The condenser lens 2 is designed in such a manner that a position of an exit plane of the light source unit 1 and a position of an entrance plane of the fly-eye optical system 3 are optically located on a Fourier conjugate plane for each other. Such an illumination system is called Kohler illumination. The condenser lens 2 is illustrated as one planoconvex lens in FIG. 3, but is often formed by a group of a plurality of lenses in practice.

Figure 4:
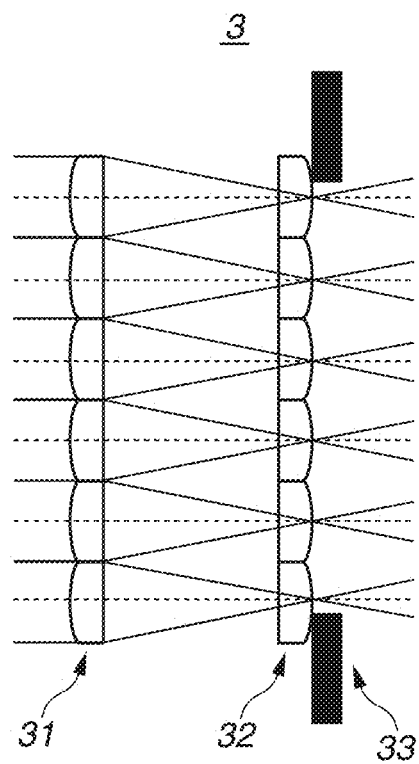
FIG. 4 is a schematic view of a fly-eye optical system.

FIG. 4 illustrates a schematic cross-sectional view of the fly-eye optical system 3. The fly-eye optical system 3 includes two lens groups 31 and 32 and an aperture stop 33. Each of the lens groups 31 and 32 is a lens group prepared by gluing a plurality of planoconvex lenses together in such a manner that edge surfaces thereof are located on the same plane. The lens groups 31 and 32 are disposed in such a manner that, at a focal position of each of the individual planoconvex lenses, a planoconvex lens paired with it is positioned. Due to the use of the thus-configured fly-eye optical system 3, a plurality of secondary optical source images conjugate with the exit plane of the light source unit 1 is formed at a position of an exit plane of the fly-eye optical system 3.

Figure 5:
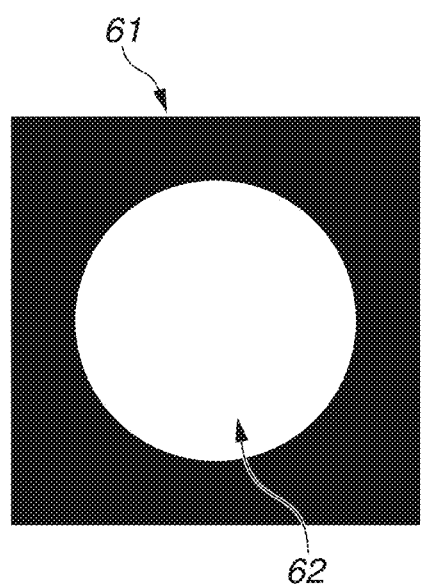
FIG. 5 illustrates an aperture stop.

The aperture stop 33 illustrated in FIG. 5 is provided near the fly-eye optical system 3. The aperture stop 33 includes a portion 62 (an aperture) that permits transmission of the light therethrough, and a portion 61 that blocks the transmission of the light therethrough. The light emitted from the exit plane of the fly-eye optical system 3 and transmitted through the light-transmissive portion 62 of the aperture stop 33 reaches an illumination plane 5 via the condenser lens 4.

The condenser lens 4 is designed in such a manner that the exit plane of the fly-eye optical system 3 and the illumination plane 5 are optically located on a Fourier conjugate plane for each other, and the exit plane of the fly-eye optical system 3 or the conjugate plane thereof serves as a pupil plane of the illumination optical system 200. In this case, light intensity distributions from respective secondary light sources formed on the exit plane of the lens group 32 are added together in a superimposed manner on the illumination plane 5, and therefore an approximately even light intensity distribution can be established. The fly-eye optical system 3 has a function of making the light intensity distribution even, and is called an optical integrator. Examples of the optical integrator include a microlens array and a fly-eye lens, and a lens array prepared by continuously forming lenses by etching or the like, or a lens array prepared by joining individual lenses together can be used as the optical integrator. Further, the present configuration can also be applied to an internal reflection-type optical integrator, which reflects light from an entrance end surface on an inner surface thereof a plurality of times and emits light with the even light intensity distribution from a reflective end surface. Examples of the internal reflection-type optical integrator include an optical rod and an optical pipe.

The field stop 6 is disposed near the illumination plane 5. The light flux emitted from an aperture portion of the field stop 6 is imaged on an illumination target surface 8 by the imaging optical system 7. The imaging optical system 7 has a desired magnification, and an illumination region cut out by the field stop 6 is projected onto the illumination target surface 8.

Figure 6A:
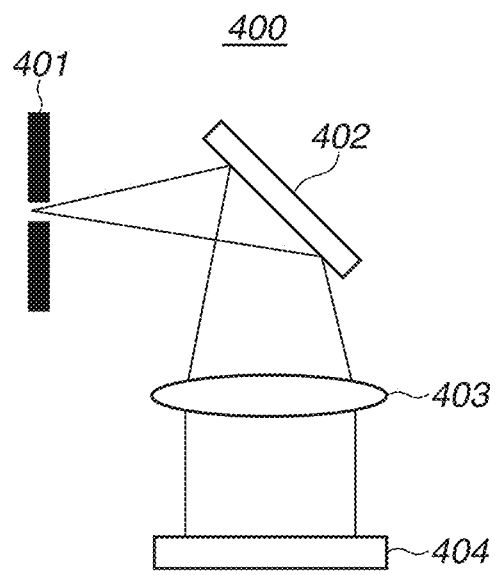
FIGS. 6A and 6B are each a schematic view of a measurement unit.

The illumination optical system 200 includes a measurement unit (a measurement apparatus) 400, which measures the light intensity distribution (an effective light source distribution) on the pupil plane. The measurement unit 400 is disposed in an optical path at the time of the measurement, and measures a pupil intensity distribution. FIG. 6A illustrates a schematic view of the measurement unit 400. The measurement unit 400 is disposed behind the pupil plane on which the intensity distribution is desired to be measured (for example, an A plane), and detects a part of the light flux incident on the A plane. A pinhole plate 401 having a pinhole is disposed near the A plane, and the light flux emitted from the pinhole plate 401 based on a certain angular distribution is bent on a deflection mirror 402 at 90 degrees. After that, the light flux is refracted at a lens 403 having positive power, is transformed into approximately collimated light, and is incident on a detector 404 such as a charge coupled device (CCD) camera. The light with a light distribution detected by the detector 404 is converted into an electric signal, and the electric signal is fed into a data processing apparatus such as a computer.

Figure 6B:
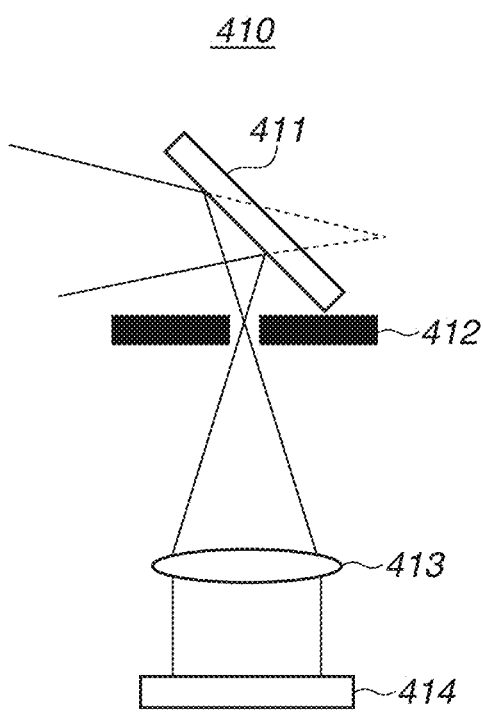

Further, a measurement unit 410, which measures the pupil intensity distribution, may be disposed in front of the illumination target surface 8, and detect a part of the light flux incident on a B plane. FIG. 6B illustrates a schematic view of the measurement unit 410. The part of the light flux incident on the illumination target surface 8 is bent on a deflection mirror 411 at 90 degrees before being incident on the illumination target surface 8. A pinhole plate 412 having a pinhole is disposed at a position of an optical path length that corresponds to the illumination target surface 8 if the light flux is not bent. The light flux emitted from the pinhole plate 412 based on a certain angular distribution is refracted on a lens 413 having positive power, is transformed into approximately collimated light, and is incident on a detector 414 such as a CCD camera.

The measurement units 400 and 410 are measurement units working based on essentially the same principle, although being different from each other in terms of the configuration of the optical elements therein. In a case where a distance between the pinhole and the CCD surface is extremely long compared to a pinhole diameter, the lens 403 and the lens 413 may also be omitted.

Figure 7D:
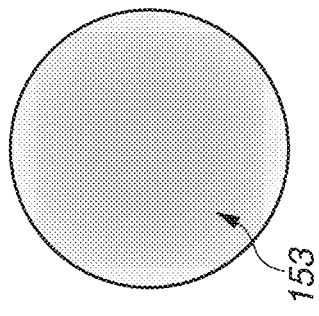
FIGS. 7A, 7B, 7C, 7D, and 7E each illustrate a pupil intensity distribution.
Figure 7E:
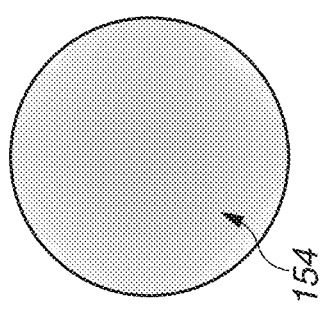
Figure 7C:
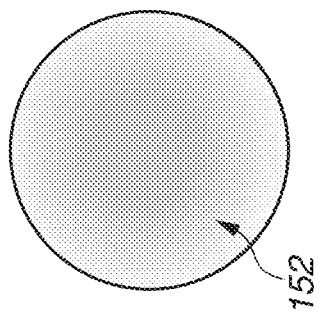
Figure 7A:
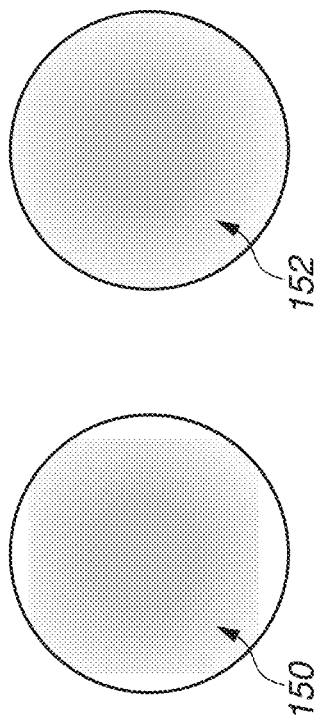

In a case where the LED array 100 illustrated in FIG. 2A is implemented as the light source unit 1, the pupil intensity distribution is formed like a distribution 150 illustrated in FIG. 7A. A circle indicated by a solid line in FIG. 7A is a circle corresponding to an effective diameter on the pupil plane of the illumination optical system 200. In other words, the intensity distribution placed inside this circle corresponds to an angular distribution illuminating some point on the illumination target surface 8. In the distribution 150, an intensity in an oblique direction is high compared to vertical and horizontal directions in the pupil plane, and a difference is generated in the intensity between the directions (azimuths or orientations). This is because the shape of the LED chip 52 is quadrilateral, and an outline thereof is partially projected. The intensity in the vertical and horizontal directions reduces at portions corresponding to outer sides of edges of the LED chip 52, but the intensity in the oblique direction at 45 degrees is maintained to some degree as far as portions corresponding to corners of the LED chip 52.

Figure 7B:
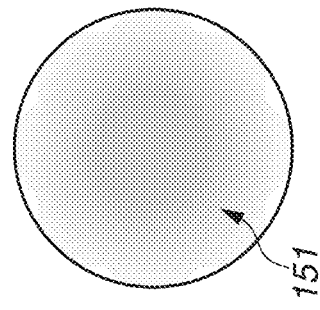

In a case where the LED array 101 illustrated in FIG. 2B is implemented as the light source unit 1, the pupil intensity distribution is formed like a distribution 151 illustrated in FIG. 7B. The distribution 151 is formed into a light intensity distribution obtained from a combination of the light from the LED chips 52 in the subunit 21 and the light from the subunit 22 arranged such that the LED chips 52 are inclined at approximately 45 degrees. In this manner, arranging the LED chips 52 at the different orientations from each other allows the distribution 151 to reduce the difference (unevenness) in the intensity between the vertical and horizontal directions and the oblique direction compared to the distribution 150.

In a case where the LED array 102 or 103 illustrated in FIG. 2C or 2D is implemented as the light source unit 1, the pupil intensity distribution is formed like a distribution 152 illustrated in FIG. 7C. The distribution 152 is formed into a light intensity distribution obtained from a combination including the light from the subunits 23 and 24 in which the chips 52 are arranged so as to be inclined at +22.5 degrees and −22.5 degrees, respectively, in addition to the light from the subunits 21 and 22. In the distribution 152, the difference (the unevenness) in the intensity further reduces between the directions in the plane compared to the distribution 151.

In the present exemplary embodiment, each of the subunits 21 to 24 can be controlled in such a manner that, for example, the intensity of the light emitted from the subunit 21 exceeds the intensity of the light emitted from the other subunits 22, 23, and 24 in the case where the LED array 102 is implemented as the light source unit 1. More specifically, the currents to apply to the LED chips 52 in the subunit 21 are controlled so as to exceed the currents to apply to the LED chips 52 in the other subunits 22 to 24. In other words, different outputs are produced among the plurality of LED chips 52 arranged at the different orientations from one another. In this case, the currents applied to all or a part of the LED chips 52 in the subunit 21 can be changed. Then, the pupil intensity distribution is formed like a distribution 153 illustrated in FIG. 7D. In other words, the pupil intensity distribution is formed into a distribution containing an intensity difference between the vertical and horizontal directions and the oblique direction compared to the distribution 152. On the other hand, when the LED chips 52 are controlled in such a manner that the intensities of the light fluxes emitted from the subunits 22, 23, and 24 of the LED array 102 exceed the subunit 21, the pupil intensity distribution is formed like a distribution 154 illustrated in FIG. 7E.

In this manner, the light intensity distribution on a predetermined surface, i.e., the pupil plane of the illumination optical system 200 can be adjusted into a desired intensity distribution by controlling the output of the LED array according to the present exemplary embodiment. A control unit of the illumination optical system 200 may set a targeted intensity distribution and control the output of each of the LEDs in the LED array in such a manner that the actual pupil intensity distribution matches the targeted intensity distribution based on the intensity distribution measured by the measurement unit 400 or 410.

The above-described light source apparatus 1 and illumination optical system 200 can be employed for various kinds of illumination apparatuses, and can also be used for an apparatus that illuminates optically curable resin, an apparatus that inspects a subject by illuminating it, a lithography apparatus, and the like. For example, the above-described light source apparatus 1 and illumination optical system 200 can be employed for an exposure apparatus that exposes a substrate to form a pattern of a mask thereon, a mask-less exposure apparatus, an imprint apparatus that forms a pattern on a substrate with use of a mold, or a planarization layer formation apparatus.

An example of the exposure apparatus will be described with reference to FIG. 8. FIG. 8 illustrates a schematic view of the exposure apparatus. An exposure apparatus 300 includes the illumination optical system 200 that illuminates a photomask 10, and a projection optical system 11 that projects a pattern of the photomask 10 onto a wafer 12. The projection optical system 11 may be a projection lens formed by a lens or a reflective projection system using a mirror. A stage holding and driving the photomask 10 and the wafer (the substrate) 12 is used, although being not illustrated in FIG. 8.

The photomask 10 is disposed near the illumination target surface 8 of the illumination optical system 200 (an exposure unit). A fine pattern is formed on the photomask 10 with use of a metallic film such as chromium. Illumination light with which the photomask 10 is irradiated is diffracted based on the pattern of the photomask 10. The diffracted light is imaged on the wafer 12 by the projection optical system 11 (the exposure unit).

Figure 9A:
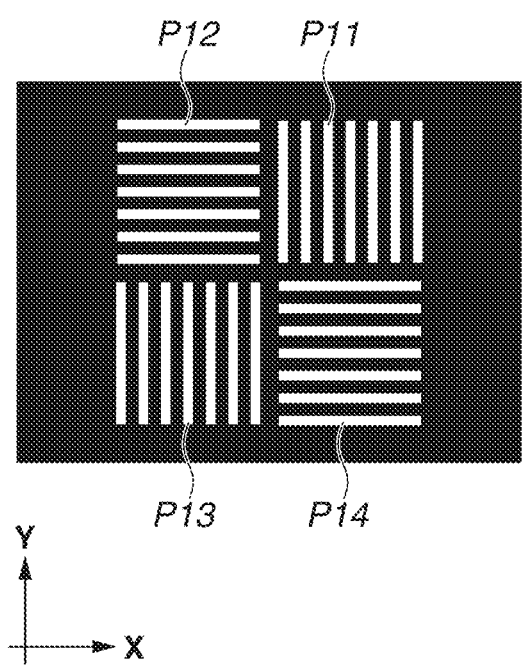
FIGS. 9A and 9B each illustrate a pattern of an evaluation mask.
Figure 9B:
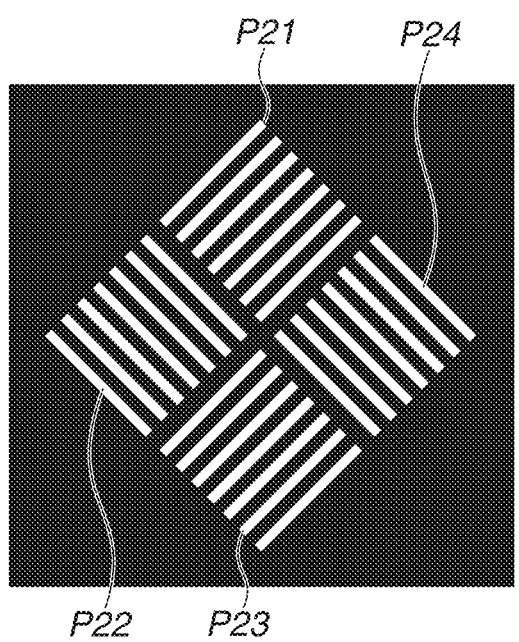

FIGS. 9A and 9B each illustrate an example of a pattern of an evaluation mask. A mask illustrated in FIG. 9A includes patterns P11 and P13 of lines lined up periodically in an X (horizontal) direction and extending in a Y (vertical) direction, and patterns P12 and P14 of lines lined up periodically in the Y direction and extending in the X direction. A mask illustrated in FIG. 9B includes patterns P21 to P24 of lines lined up periodically in an oblique direction inclined at 45 degrees with respect to the X direction and the Y direction.

An angular distribution of a light flux incident on some one point of the photomask 10 corresponds to the light intensity distribution on the pupil plane of the illumination optical system 200, and affects an imaging performance of the exposure apparatus 300. For example, when the intensity is different between the vertical direction and the horizontal direction in the pupil intensity distribution, the intensity is different between diffracted light contributing to imaging based on a vertically extending pattern formed on the mask 10 and diffracted light contributing to imaging based on a horizontally extending pattern. Therefore, a difference is undesirably generated between line widths of the vertical and horizontal patterns imaged on the wafer surface. Further, in the case of the pupil intensity distribution 150 formed as illustrated in FIG. 7A, a difference may be generated between the line width of the vertical or horizontal pattern and the line width of the pattern extending in the oblique direction. In this manner, the presence of the unevenness in the pupil intensity distribution leads to deterioration of the imaging performance of the exposure apparatus 300. Therefore, generally, it is desirable that the pupil intensity distribution is rotationally symmetric and even in the plane.

However, there are many possible influential factors affecting the actual imaging performance of the exposure apparatus 300, besides the pupil intensity distribution of the illumination optical system 200. One example thereof is an aberration and a pupil intensity distribution of the projection optical system 11, a vibration of the exposure apparatus 300, an influence due to heat, and an influence due to an exposure process. These factors are added and combined in a complicated manner, and determine the imaging performance.

Therefore, the present exemplary embodiment corrects the deterioration of the imaging performance that has occurred due to a factor different from the pupil intensity distribution of the illumination optical system 200, by changing the pupil intensity distribution of the illumination optical system 200 into a desired distribution. One example thereof will be described now, assuming that the LED array 102 is implemented in the light source unit 1. When the difference appears in the line width between the vertical and horizontal patterns and the oblique pattern exposed by the exposure apparatus 300, the present exemplary embodiment sets the pupil intensity distribution of the illumination optical system 200 like the distribution 153 illustrated in FIG. 7D. In other words, the present exemplary embodiment sets such a distribution that the intensity difference is generated between the vertical and horizontal directions and the oblique direction instead of establishing the even pupil intensity distribution. As a result, the pupil intensity distribution can be corrected so as to eliminate the difference in the line width between the vertical and horizontal patterns and the oblique pattern that has occurred due to the factor different from the pupil intensity distribution of the illumination optical system 200.

However, the output should be adjusted among the plurality of LED chips 52 oriented at the different angles from one another in careful consideration of an imaging characteristic of the pattern, such as which has a greater line width, the vertical and horizontal patterns or the oblique pattern. When the intensities of the light fluxes emitted from the subunits 22, 23, and 24 of the LED array 102 are set so as to exceed the subunit 21, the pupil intensity distribution is formed like the distribution 154 as illustrated in FIG. 7E. In this case, the difference in the line width between the vertical and horizontal patterns and the oblique pattern is corrected in an opposite direction compared to the distribution 153.

The amount and direction of the adjustment made to the intensity in the pupil intensity distribution may be determined based on a trial and error that repeats the adjustment and the measurement of the pattern imaging characteristic, or may be determined based on an image simulation in light of a characteristic of the photosensitive material on the wafer 12 and another process condition.

Alternatively, a relationship between a value of the current to apply to each of the LED chips 52 in the subunits 21 to 24 of the LED array or a light amount of the light emitted therefrom, and a performance of imaging the pattern to project onto the wafer 12 may be acquired for each pattern type (a direction, a cycle, a shape, and the like) in advance. As a result, an optimum input current for each of the LED chips 52 can be determined according to the pattern of the mask in actual use, and the imaging performance can be adjusted with respect to various patterns.

In this manner, according to the exposure apparatus 300 of the present exemplary embodiment, the imaging performance with respect to the various types of patterns can be adjusted by controlling the pupil intensity distribution into the desired distribution by means of the LED array.

FIG. 10 illustrates another example of the exposure apparatus. An exposure apparatus n100 illustrated in FIG. 10 includes illumination optical systems that illuminate a mask M, and a projection optical system that projects a pattern of the mask M onto a substrate S. The mask M is movably held on a mask stage, and the substrate S is movably held on a substrate stage.

The illumination optical systems form a plurality of illumination regions n10a, n10b, and n10c lined up along a Y direction on the mask M with use of light from a light source n1.

The light source unit 1 including the above-described LED array can be employed as the light source n1. The light from the light source n1 is incident on an entrance end of a light guide n3 via a lens n2. The light guide n3 is constructed with use of randomly bundled optical fibers, and forms an even light intensity distribution at each of exist ends n3a and n3b thereof. A light flux output from the exit end n3a of the light guide n3 is incident on a fly-eye lens n5a via a relay lens n4a. A plurality of secondary light sources is formed on an exit plane side of the fly-eye lens n5a. A field stop n7a having a rectangular aperture portion is evenly illuminated with the light from the plurality of secondary light sources via a condenser lens n6a provided in such a manner that a front-side focal point is located at a position where the secondary light sources are formed. The mask M is illuminated with the light from the aperture portion of the field stop n7a, an optical path of which is deflected by a mirror n9a at 90 degrees via a relay optical system n8a. The relay optical system n8a is an optical system that makes the field stop n7a and the mask M optically conjugate with each other, and forms the illumination region n10a, which is an image of the aperture portion of the field stop n7a.

A light flux output from the exit end n3b of the light guide n3 is incident on a fly-eye lens n5b via a relay lens n4b. A plurality of secondary light sources is formed on an exit plane side of the fly-eye lens n5b. A field stop n7b having a rectangular aperture portion is evenly illuminated with the light from the plurality of secondary light sources via a condenser lens n6b provided in such a manner that a front-side focal point is located at a position where the secondary light sources are formed. The mask M is illuminated with the light from the aperture portion of the field stop n7b, an optical path of which is deflected by a mirror n9b at 90 degrees via a relay optical system n8b. The relay optical system n8b is an optical system that makes the field stop n7b and the mask M optically conjugate with each other, and forms the illumination region n10b, which is an image of the aperture portion of the field stop n7b.

An illumination optical system IL, which forms the illumination region n10c, can also be configured as in the above-described optical system. The exposure apparatus n100 includes as many exit ends of the light guide n3 as the number of illumination regions, and the illumination light fluxes are supplied from the exit ends of the light guide n3 to these illumination regions via the plurality of illumination optical systems, respectively. The aperture portion of the field stop is not limited to the rectangular shape, and may be trapezoidal or rhombic. Further, the number of illumination regions is not limited to three, and may be four or more.

Next, the projection optical system will be descried. The projection optical system includes as many projection optical system modules as the number of illumination regions formed by the illumination optical systems, and is formed by an unmagnified and erect-image optical system. Each of the projection optical system modules is configured identically. Each of the projection optical system modules has a structure in which two sets of Dyson-type optical systems (a first partial optical system and a second partial optical system) are combined.

Each of the partial optical systems includes a right angle prism having a reflective surface arranged so as to be inclined at 45 degrees while facing the mask M, a lens group having an optical axis along an in-plane direction of the mask M, and a spherical reflective mirror that reflects the light transmitted through the lens group.

The light from the illumination region n10a that is transmitted through the mask M is incident on a lens group n12a with the optical path deflected by a right angle prism n11a at 90 degrees. The light from the right angle prism n11a is refracted by the lens group n12a, and reaches a spherical reflective mirror n13a to be then reflected thereby. The reflected light reaches the right angle prism n11a via the lens group n12a. The light from the lens group n12a forms a primary image of the mask M on an exist plane side of the right angle prism n11a with the optical path deflected by the right angle prism n11a at 90 degrees. At this time, a primary image of the mask M that is formed by the first partial optical system is an unmagnified image having a positive lateral magnification in the X direction and a negative lateral magnification in the Y direction.

The light from the primary image forms a secondary image of the mask M on the surface of the substrate S via the second partial optical system. The second partial optical system is configured similarly to the first partial optical system. The optical path is deflected by a right angle prism n14a at 90 degrees, and the light is incident on a lens group n15a. The light from the right angle prism n14a is refracted by the lens group n15a, and reaches a spherical reflective mirror n16a to be then reflected thereby. The reflected light reaches the right angle prism n14a via the lens group n15a. The light from the lens group n15a forms the secondary image of the mask M on an exist plane side of the right angle prism n14a with the optical path deflected by the right angle prism n14a at 90 degrees. The second partial optical system forms an unmagnified image positive in the X direction and negative in the Y direction, similarly to the first partial optical system. Therefore, the secondary image formed on the substrate S indicates an unmagnified erect image of the mask M, and forms an exposure region n17a.

Regarding the illumination region n10c, similarly, the optical path therefor is deflected by a right angle prism n11c at 90 degrees, and the light is incident on a lens group n12c. The light from the right angle prism n11c is refracted by the lens group n12c, and reaches a spherical reflective mirror n13c to be then reflected thereby. The reflected light reaches the right angle prism n11c via the lens group n12c. The light from the lens group n12c forms a primary image of the mask M on an exist plane side of the right angle prism n11c with the optical path deflected by the right angle prism n11c at 90 degrees. Then, the optical path is deflected by a right angle prism n14c at 90 degrees, and the light is incident on a lens group n15c. The light from the right angle prism n14c is refracted by the lens group n15c, and reaches a spherical reflective mirror n16c to be then reflected thereby. The reflected light reaches the right angle prism n14c via the lens group n15c. The light from the lens group n15c forms a secondary image of the mask M on an exist plane side of the right angle prism n14c with the optical path deflected by the right angle prism n14c at 90 degrees. An exposure region n17c is formed on the substrate S.

The illumination region n10b is also projected onto the substrate S by a similarly configured projection optical system module, and an exposure region n17b is formed on the substrate S. As a result, the three exposure regions n17a, n17b, and n17c lined up along the Y direction are formed on the substrate S by each of the projection optical system modules.

The exposure apparatus n100 carries out the scanning exposure of the substrate S by moving the mask M and the substrate S relative to each other in the X-axis direction. The substrate S is exposed for the exposure regions n17a, a17b, and n17c, and can be exposed without any space generated with side end portions overlapping each other for the exposure regions n17a, a17b, and n17c.

Employing the light source unit 1 including the above-described LED array as the light source n1 allows the pupil intensity distribution to be controlled into the desired distribution, thereby allowing the imaging performance to be adjusted with respect to the various types of patterns.

(Method for Manufacturing Object)

Next, a method for manufacturing an object (a semiconductor integrated circuit (IC) element, a liquid crystal display element, a color filter, a microelectromechanical system (MEMS), and the like) with use of the above-described exposure apparatus will be described. The object is manufactured by a process of exposing a substrate (a wafer, a glass substrate, or the like) with a photosensitive agent applied thereon with use of the above-described exposure apparatus, a process of developing this substrate (the photosensitive agent), and a process of subjecting the developed substrate to another known processing process. Examples of the another known process include etching, a removal of a resist, dicing, bonding, and packaging. According to the present manufacturing method, a more high-quality object than the conventional technique can be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-225486, filed Nov. 30, 2018, which is hereby incorporated by reference herein in its entirety.

What is claimed is:

1. An exposure apparatus comprising:
an illumination apparatus configured to illuminate a mask;
a condenser lens having positive power;
an optical integrator; and
an exposure unit configured to expose a substrate to form a pattern of the mask thereon,
wherein the illumination apparatus includes a light source apparatus including an LED array and a controller,
the LED array includes a plurality of subunits,
a first subunits includes a plurality of LED chips arranged on a substrate at a first angle, and a second subunit includes a plurality of LED chips arranged on the substrate at a second angle different form the first angle,
the controller is configured to control the plurality of LED chips; and
the controller controls the first subunit and the second subunit to differential intensity of light emitted from the first subunit and intensity of light emitted from the second subunit, thereby changing a light intensity distribution that the plurality of LED chips forms on a predetermined surface.

2. The exposure apparatus according to claim 1, wherein the controller controls the output of the at least one of the plurality of LED chips based on an imaging characteristic of the pattern.

3. The exposure apparatus according to claim 1, wherein the controller causes the different outputs to be produced from the LED chips between the plurality of subunits by collectively controlling outputs of the plurality of LED chips included in each of the subunits.

4. The exposure apparatus according to claim 1, wherein the light density distributions formed respectively by the subunits each including the plurality of LED chips are formed on the predetermined surface by rotating a light flux from the plurality of LED chips.

5. The exposure apparatus according to claim 1, wherein the condenser lens is designed in such a manner that an exit plane of the optical integrator and the predetermined surface are optically located on a conjugate plane for each other.

6. The exposure apparatus according to claim 1, further comprising a measurement apparatus configured to measure a pupil intensity distribution on a pupil plane of the illumination apparatus, wherein the controller controls an output of at least one of the plurality of LED chips based on the pupil intensity distribution measured by the measurement apparatus, thereby changing a light intensity distribution that the plurality of LED chips forms on the predetermined surface.

7. The exposure apparatus according to claim 1, wherein the controller controls the output of the LED chips to form a light intensity distribution containing an intensity different between vertical and horizontal directions, and an oblique direction.

8. A method for manufacturing an object, the method comprising:
exposing a substrate with use of an exposure apparatus;
developing the exposed substrate; and
acquiring the object from the developed substrate,
wherein the exposure apparatus includes
an illumination apparatus including a light source apparatus, a condenser lens having positive power, and an optical integrator, the illumination apparatus being configured to illuminate a mask, the light source apparatus including an LED array and a controller, the LED array including a plurality of subunits,
wherein a first subunit includes a plurality of LED chips arranged on a substrate at a first angle and a second subunit includes a plurality of LED chips arranged on a substrate at a second angle different form the first angle, and
wherein the controller controls the first subunit and the second subunit to differentiate the intensity of light emitted from the first subunit and the intensity of the light emitted from the second subunit, thereby changing a light intensity distribution that the plurality of LED chips forms on a predetermined surface.

* * * * *